United States Patent
Rajamaki et al.

(10) Patent No.: US 9,759,782 B2
(45) Date of Patent: Sep. 12, 2017

(54) IMPEDANCE-BASED BATTERY STATE ESTIMATION METHOD

(71) Applicant: Nokia Technologies Oy, Espoo (FI)

(72) Inventors: Markku Rajamaki, Littoinen (FI); Jarno Rajala, Littoinen (FI)

(73) Assignee: Nokia Technologies OY, Espoo (FI)

(*) Notice: Subject to any disclaimer, the term of this patent is extended or adjusted under 35 U.S.C. 154(b) by 195 days.

(21) Appl. No.: 14/672,799

(22) Filed: Mar. 30, 2015

(65) Prior Publication Data

US 2015/0309122 A1    Oct. 29, 2015

(30) Foreign Application Priority Data

Apr. 3, 2014 (FI) .................................. 20145324

(51) Int. Cl.
| | | |
|---|---|---|
| *H01M 10/44* | (2006.01) | |
| *H01M 10/46* | (2006.01) | |
| *G01R 31/36* | (2006.01) | |
| *H02J 7/00* | (2006.01) | |

(52) U.S. Cl.
CPC ..... *G01R 31/3662* (2013.01); *G01R 31/3606* (2013.01); *H02J 7/007* (2013.01); *H02J 2007/005* (2013.01)

(58) Field of Classification Search
CPC ....... H02J 7/0026; H02J 7/0021; H02J 7/0093
USPC ......... 320/107, 132, 141, 149; 324/429, 430
See application file for complete search history.

(56) References Cited

U.S. PATENT DOCUMENTS

| | | | |
|---|---|---|---|
| 7,199,588 B2* | 4/2007 | Blessing | ............... H01M 10/48 324/427 |
| 2002/0075003 A1 | 6/2002 | Fridman et al. | |
| 2004/0135581 A1 | 7/2004 | Blessing et al. | |
| 2011/0148424 A1 | 6/2011 | Chiang et al. | |

FOREIGN PATENT DOCUMENTS

| | | |
|---|---|---|
| JP | 2000-121710 A | 4/2000 |
| JP | 2008-067523 A | 3/2008 |

OTHER PUBLICATIONS

Office action received for corresponding Finland Patent Application No. 20145324, dated Apr. 9, 2014, 1 page.
Office action received for corresponding Finland Patent Application No. 20145324, dated Nov. 12, 2014, 7 pages.

* cited by examiner

Primary Examiner — Edward Tso
(74) Attorney, Agent, or Firm — Banner & Witcoff, Ltd.

(57) ABSTRACT

The invention relates to a method, The method comprises measuring a first battery voltage of a battery of a device at and a first charging current after terminating a constant current charging mode and before initiating a constant voltage charging mode, producing a charging impulse on the battery, measuring a second battery voltage and a second charging current, and determining an impedance of the battery on the basis of a voltage difference between the first and the second battery voltage and a difference between the first and the second charging current. The invention further relates to an apparatus and a computer program product that perform the method.

16 Claims, 3 Drawing Sheets

IMPEDANCE-BASED BATTERY STATE ESTIMATION METHOD

BACKGROUND

Today's mobile phones and other portable electronic devices use "non-user replaceable" batteries. In many cases those "non-user replaceable" batteries are well known power sources for mobile devices, usually Lithium-ion/Li-polymer (later Li-ion) batteries. Those batteries have limited lifetime and their charging/powering capacity may degrade over time. In addition, Li-ion batteries may swell and thus they may damage the mobile device, if not replaced in time.

Battery charging, especially fast charging of Li-ion batteries is the main reason for swelling. For figuring out the state of "non-user replaceable" batteries may be time consuming, expensive and a professional person is needed for the replacing operation. The professional person may estimate the state of the battery by measuring the thickness of the battery after removing it from the mobile device. If the professional person detects a slightly swollen battery, the mobile device may change charging schema of that battery and thus prevent excess swelling.

SUMMARY

Now there has been invented an improved method for determining a state of a battery of a device and technical equipment implementing the method. Various aspects of the invention include a method, an apparatus, and a computer readable medium comprising a computer program stored therein, which are characterized by what is stated in the independent claims. Various embodiments of the invention are disclosed in the dependent claims.

According to a first aspect, there is provided a method, comprising measuring a first battery voltage of a battery of a device and a first charging current after terminating a constant current charging mode, producing a charging impulse on the battery measuring a second battery voltage and a second charging current, and determining an impedance of the battery on the basis of a voltage difference between the first and the second battery voltage and a difference between the first and the second charging current.

According to an embodiment, the second charging current is the current of the charging impulse. According to an embodiment, the method comprises determining a state of the battery on the basis of the determined impedance. According to an embodiment, the state of the battery is determined by comparing the determined impedance to other impedances determined for the battery. According to an embodiment, the state of the battery is determined by comparing the determined impedance to average impedance values determined for the battery. According to an embodiment, the state of the battery is determined by comparing the determined impedance to individual impedance values or average impedance values of at least one same type of battery. According to an embodiment, the method further comprises indicating the state of the battery if determined impedance exceeds a predetermined threshold value arranged for the determined impedance. According to an embodiment, the method further comprises adjusting charging parameters of the device on the basis of the determined impedance.

According to a second aspect, there is provided an apparatus comprising at least one processor, memory including computer program code, the memory and the computer program code configured to, with the at least one processor, cause the apparatus to perform at least the following: measure a first battery voltage of a battery of a device at a first charging current after terminating a constant current charging mode and before initiating a constant voltage charging mode, produce a charging impulse on the battery, measure a second battery voltage, and determine an impedance of the battery on the basis of a voltage difference between the first and the second battery voltage and a difference between the first and the second charging current.

According to an embodiment, the second charging current is the current of the charging impulse. According to an embodiment, the computer program code is further configured to, with the at least one processor, cause the apparatus to determine a state of the battery on the basis of the determined impedance. According to an embodiment, the state of the battery is determined by comparing the determined impedance to other impedances determined for the battery. According to an embodiment, the state of the battery is determined by comparing the determined impedance to average impedance values determined for the battery. According to an embodiment, the state of the battery is determined by comparing the determined impedance to individual impedance values or average impedance values of at least one same type of battery. According to an embodiment, the computer program code is further configured to, with the at least one processor, cause the apparatus to indicate the state of the battery if determined impedance exceeds a predetermined threshold value arranged for the determined impedance. According to an embodiment, the computer program code is further configured to, with the at least one processor, cause the apparatus to adjust charging parameters of the device on the basis of the determined impedance.

According to a third aspect, there is provided an apparatus comprising means for measuring a first battery voltage of a battery of a device at a first charging current after terminating a constant current charging mode and before initiating a constant voltage charging mode, means for producing a charging impulse on the battery, means for measuring a second battery voltage and a second charging current, and means for determining an impedance of the battery on the basis of a voltage difference between the first and the second battery voltage and a difference between the first and the second charging current.

According to a fourth aspect, there is provided a computer program product embodied on a non-transitory computer readable medium, comprising computer program code configured to, when executed on at least one processor, cause an apparatus to: measure a first battery voltage of a battery of a device at a first charging current after terminating a constant current charging mode and before initiating a constant voltage charging mode, produce a charging impulse on the battery, measure a second battery voltage, and determine an impedance of the battery on the basis of a voltage difference between the first and the second battery voltage and a difference between the first and the second charging current.

DESCRIPTION OF THE DRAWINGS

In the following, various embodiments of the invention will be described in more detail with reference to the appended drawings, in which.

DESCRIPTION OF EXAMPLE EMBODIMENTS

Figure 1:
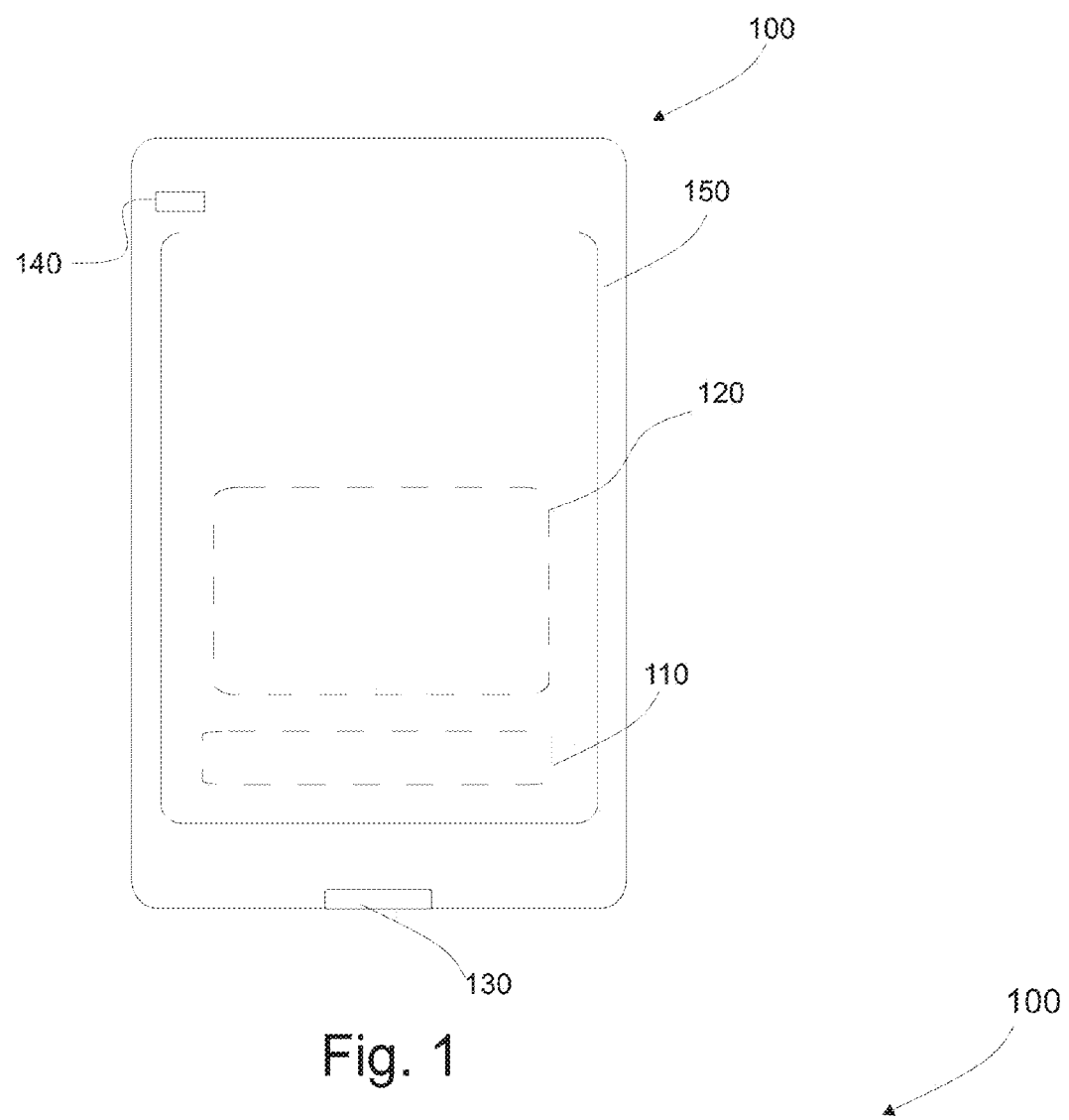
FIG. 1 shows an example of a device according to an embodiment.

It is challenging to estimate the state (age) of a non-user replaceable battery, for example, Li-on battery, inside a mobile device without the removal of the battery by a professional person, who may analyze the battery in laboratory conditions. In this traditional approach comprising removing of the battery from the device, the analyzing may base on a capacity measurement or various kinds of impedance determinations. This kind of analyzing in laboratory conditions may, however, be expensive and time consuming. It is also possible to fully charge and discharge the battery to estimate the state of the battery. However, the user may not perform this by himself either. Battery state drops i.e. battery ages due to battery charging cycles. Battery charging cycles may affect battery's charge capacity and its ability to accept a charge, but also in physical appearance, for example, it may swell. Therefore, it is advantageous to be aware of the age of the non-user replaceable battery.

A mobile device in this context may be a device, for example, any portable device comprising a battery that is not replaceable by a regular user of the device. However, embodiments described herein may also be used to analyze a state of a user replaceable battery. The device may be, for example, a mobile phone, a mobile computer, a mobile collaboration device, a mobile internet device, a smart phone, a tablet computer, a tablet personal computer (PC), a personal digital assistant, a handheld game console, a portable media player, a digital still camera (DSC), a digital video camera (DVC or digital camcorder), a pager, or a personal navigation device (PND).

Instead of the traditional approach of estimating the state of the battery, the embodiments of the invention use a method for estimating the state of the battery, a so-called battery state method that may be used for determining the state of the battery without removing the battery from the device and without any end user actions. The idea is to implement an additional impedance-based estimation and controlling circuit structure, a so-called battery state circuit, in a device, which circuit may determine the state of the battery in context with charging, automatically. In addition, the battery state circuit may adjust charging parameters of the device, charging current and/or charging voltage may be rejected, so that charging may be done by lower constant current i.e. charge the battery slower and/or lower than the maximum charging voltage level i.e. not charge up the battery to its full capacity. By adjusting charging parameters of the device it may be possible to prevent damages of the battery and/or increase the battery life.

In the battery state method the battery impedance of the battery is measured twice. The measurements may be performed, for example, after the constant current (CC) mode charging of the battery 13 before beginning the constant voltage (CV) charging state. The constant current mode may be terminated when the voltage of the battery has risen to a predetermined voltage level. The predetermined voltage level may be, for example, the voltage level when battery voltage approximately corresponds to the termination voltage of the constant current mode charging. Therefore, the predetermined voltage level as volts may be, for example, ~4.0 to 4.35V.

After the measurements the charging may continue in a constant voltage mode, where a constant charging voltage is used to charge the battery until the charging current decreases to a predetermined current level. The predetermined current level may be, for example, one tenth of the original constant charging current. For example, if the constant charging current (the current output of the charger) is around 950 mA, the predetermined current level may be 95 mA. There may be a short interruption i.e. a short time interrupt in charging scheme, a wait period, for example, 1 to 2 minutes, after the constant current mode to ensure that measurement conditions are achieved before the first measurement is performed. The short interruption before the first measurement may be advantageous, because it allows the battery to rest or relax so as to achieve a state close to electrochemical equilibrium. This short interruption period is not critical, but if there is no short interruption or if the short interruption is too short, it may cause erroneous measurement results as the battery may not have reached electrochemical equilibrium. On the other hand, a too long interruption period unnecessarily delays the measurements and determining of the battery state. In the first measurement, a battery voltage is measured, read, and used current is also read. Results may be stored in the memory of the device. After the first measurement, a short charging pulse, for example a charging pulse of one second, is applied on terminals of the battery. After the short charging pulse the second measurement is performed correspondingly as the first one. After the impedance is measured twice, the charging scheme continues with CV charging mode.

In both measurements, a battery voltage is read. Difference of the read/measured voltages and used currents of the first and the second measurements, before and after the pulse, are then used to calculate the battery impedance according to the equation $\Delta U$ (voltage)/$\Delta I$ (current)=Z (impedance). On the basis of the battery impedance it is possible to determine the state (age) of the battery. In addition to the battery output voltage, a temperature of the battery may be measured/read by the device in connection with the first and the second measurement.

The device analyzes measured impedance for determining the state of the battery. If battery state is determined to be poor, weak, i.e. the battery is determined "old" or aged, on the basis of the battery impedance, the device may change/adjust its charging parameters and/or it may indicate its battery state for its user, for example, by a display or loudspeaker. It may, for example, indicate that the battery needs to be replaced or it may indicate that it is closing down due to the poor battery state in order to avoid damages.

The measurements of impedance are advantageously performed after the CC mode, because the battery impedance is usually rather constant in that state. The impedance is less dependent on the actual/accurate voltage value and there is also less variance between measurements performed at different charging cycles. Another benefit of measuring the impedance after the CC mode is that the impedance is measured at a relatively high voltage level. Users may charge their devices, for example, phones before the battery voltage drops down. If the impedance measurement is done at a lower voltage level, such as for example 3.5 V, it may not be possible to measure the impedance as often as if the voltage level is higher, for example 4.2 V. This enables the battery state estimation method to obtain more measurements during the life time of the battery, which improves the accuracy of the battery state estimation.

Impedance values can be stored in the memory. Latest, current, impedance measurement result (or any other impedance measured before the latest impedance) may be compared to earlier stored impedances or specified fresh battery impedance (measured or received from the manufacturer of the battery), to conclude the state of the battery i.e. whether the battery is fresh or old on the basis of battery impedance. Instead of individual impedance values, it is possible to use average impedance values i.e. average value of several sequential impedance values. An average impedance value may be an impedance average of recent measurements or past measurement into which the average of recent measurements is going to be compared. On the other hand, instead of individual impedance values or average impedance values of the same battery, it is possible to use individual impedance values or average impedance values of the same type of battery or batteries.

The fresh battery impedance may be measured during the first charging cycle of a particular battery in a device or in some cases it may be measured during some random charging cycle of a particular battery, if it is known that the particular battery is not damaged. If the device detects that the battery has been changed, for example, from detecting a different battery id, it may reset the impedance measurements and start collecting the impedance data again.

As described herein, the term 'constant current charging mode' refers to a state in which a battery is charged by a charger, whereas as described herein the term 'constant voltage charging mode' refers to a state after termination of the constant current charging mode in which a battery is charged with a constant voltage and decreasing charging current until the battery is fully charger. As described herein, the term 'constant current' refers to a charging current of a constant current charging mode by which current a battery is charged i.e. it is a relatively uniform current supplied for the battery by a charger during the charging. As described herein, the term 'constant voltage' refers to a voltage of a constant voltage charging mode at which voltage a battery is charged with a decreasing charging current, i.e., it is a relatively uniform voltage supplied for the battery by a charger after termination of the constant current charging mode.

In the following, several embodiments of the invention will be described in the context of a device comprising a battery, wherein the device uses the battery state method for determining a state of the battery and optionally the method further comprises adjusting charging settings of the battery.

FIG. 1 shows an example of a battery-operated mobile device 100 with circuitry 110 for a battery state method implemented as an additional function for the device 100. It should be understood, however, that the device 100 as illustrated and hereinafter described is merely illustrative of one type of device that may benefit from various embodiments, and therefore should not be taken to limit the scope of the embodiments. As such, it should be appreciated that at least some of the components described below in connection with the device 100 may be optional and thus in an example embodiment may include more, less or different components than those described in connection with the example embodiment of FIG. 1.

The circuitry 110 of the device 100 comprises required electronics and leads. The circuitry 110 is arranged to detect/determine the state of a battery 120 of the device 100 and to control charging of the battery 120, if needed on the basis of the detection/determination. The mobile device 100 comprises a memory (FIG. 2: 210) configured to store computer program code used for detecting/determining a state of the battery 120 of the device 100 and controlling charging of the battery 120. The mobile device 100 further comprises a processor (FIG. 2: 220) that executes the program code to perform the device's 100, including circuitry's 110, functionality. The mobile device 100 further comprises a charging port 130 through which the battery 120 of the device 100 could be charged by a separate charger (not shown). However, it is also possible that the device 100 does not comprise a charging port 130; it may be inductively chargeable, in which case it comprises means for inductive charging, such as a receiver coil for receiving energy inductively and circuitry needed for inductive charging. The mobile device 100 may also comprise a temperature sensor 140 arranged to measure battery temperature, for example, at the same time point(s) where battery output voltages are measured. The mobile device 100 may further comprise a display 150 and an input/output element to provide e.g. user interface views to the display. The mobile device 100 may further have one or more physical buttons or one or more touch-screen buttons. The mobile device 100 may comprise a keypad being provided either on the display as a touch-screen keypad or on the housing of the apparatus as a physical keypad (not shown). The mobile device 100 may further comprise a microphone and loudspeaker (not shown) to receive and to transmit audio. The mobile device 100 may also comprise communication interface (not shown) configured to connect the apparatus to another device, via wireless and/or wired network, and to receive and/or transmit data by said wireless/wired network. Wireless communication can be based on any cellular or non-cellular technology, for example GSM (Global System for Mobile communication), WCDMA (Wideband Code Division Multiple Access), CDMA (Code Division Multiple Access). Wireless communication can also relate to short range communication such as Wireless Local Area Network (WLAN), Bluetooth etc. The mobile device 100 may use the loudspeaker to provide audio messages for user, such as the battery being damaged. In addition, in the display 150 the device 100 may indicate the user about state of the battery 120. It is also possible that the device comprises any other kind of sensors than the temperature sensor 140, such as camera, accelerometer, gyroscope etc. The electrical connections inside the device 100 are not shown.

Figure 2:
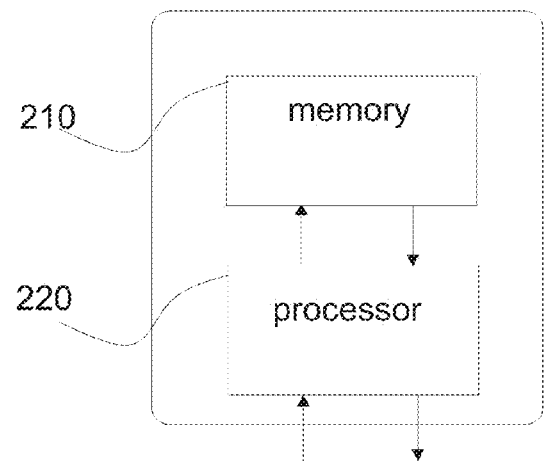
FIG. 2 shows another example of a device according to an embodiment.

FIG. 2 shows another example of a battery-operated mobile device 100 according to an embodiment. The memory 210 of the device 100 is configured to store computer program code used for the battery state method, algorithm, comprising impedance level determination of the battery 120 and optionally controlling the battery state circuitry 110, if needed, in context with charging, automatically. Controlling of the battery state circuitry 110 may comprise adjusting of charging parameters of the device 100. Impedance level determination software may be implemented as separate application and/or it can be a part of the operating system of the device 100. The processor 220 executes the program code to perform the device's and circuitry's functionality.

Figure 3:
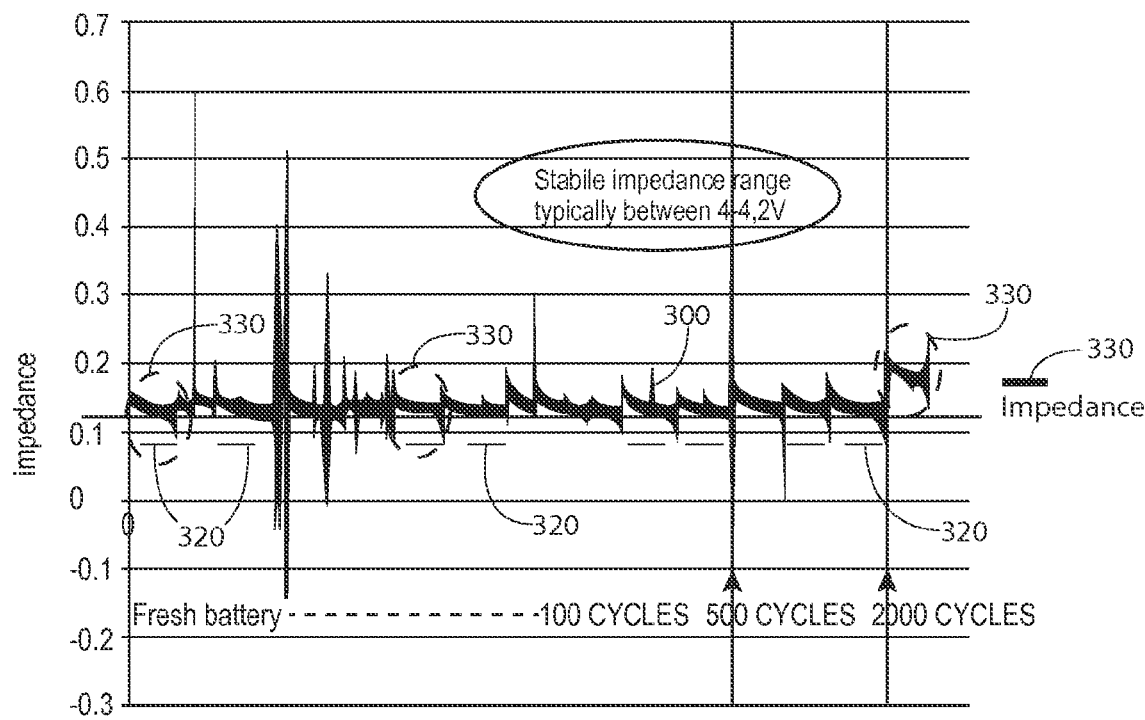
FIG. 3 shows graphically impedance level graphs as a function of charging cycles.

FIG. 3 shows a graph of impedance 300 of a battery of a device as a function of charging cycles according to an example embodiment, wherein measurements and impedance determinations are performed during a plurality of charging cycles (all charging cycles are not shown in FIG. 1). It can be seen from FIG. 3 that the impedance 300 stabilizes at the end of each charging cycle 310. The stabilization corresponds to at a battery voltage level of 4-4.2V representing a voltage corresponding to the level of termination voltage of constant current (CC) mode charging. This stabilization is due to used voltage level. Stabile impedance levels are marked by bars 320 below the impedance curve 300. It is therefore beneficial to measure the battery impedance after the constant current mode, because this will result in a more accurate estimate of the battery state. Another benefit to select this phase for performing the battery state estimation method is that charging is not interrupted in the constant current mode or the constant voltage mode.

When the battery is aged above 2000 cycles i.e. after 2000 charging cycles are performed, the level of impedance 300 at the end of the charging cycle 330 is higher compared to the level of impedance 300 at the end of the charging cycle 310 of a fresh battery. It is possible to call a battery as a fresh battery, for example, if the battery is charged 0 to 2000 timed (i.e. 0 to 2000 charging cycles).

On the basis of the impedance 300 the device may determine the state of the battery. It may, for example, determine a threshold value for the impedance 300. If the impedance exceeds the threshold value, the device may conclude that the battery is aged i.e. in poor condition. A suitable threshold to detect an old battery could be, for example, 20-50% higher impedance than impedance of new or undamaged battery. When the impedance 300 exceeds the threshold value, the device may indicate to the user that the battery is starting to get old and it should be replaced. The device may also change/adjust the charging scheme i.e. updated schema which may not cause degradation of the battery as much as the one in use. By the updated schema, the charging time may be made longer and battery may never be fully charged again. Thus, the updated schema may prevent the battery from swelling, and the battery may last longer. Battery schemes may be adjusted throughout the battery lifespan. However, it should be noted that there could be many threshold values arranged for impedance; each threshold value may indicate a different state in battery's life cycle.

Voltage and current data measured from test pulses can also be used to calculate parameters of a more complex battery impedance model, e.g. one that models battery impedance as a series of parallel capacitor-resistor pairs. Changes in these parameters might also be used to analyze battery aging in more detail.

Figure 4:
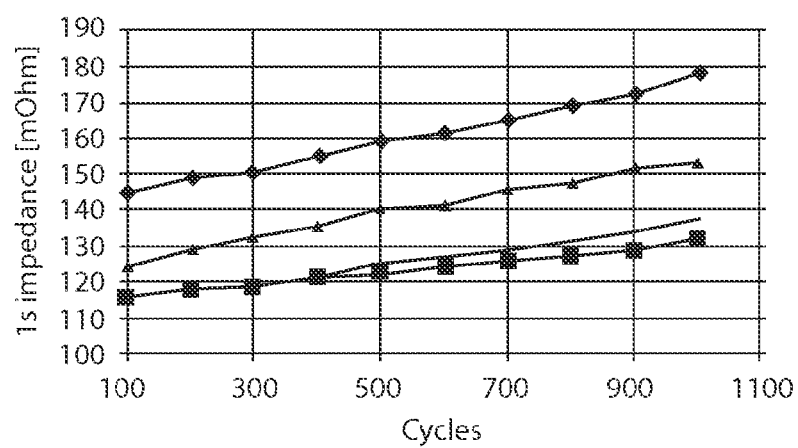
FIG. 4 shows battery impedances as a function of charging cycles.

FIG. 4 shows a graph of battery impedances as new (after 100 cycles) and as "old" (after 1000 cycles). These curves represent battery impedance of two different batteries measured at two different voltage levels. Increase in impedance may estimate swelling of the battery and maximum allowed swelling may depend on the device mechanics design.

Figure 5:
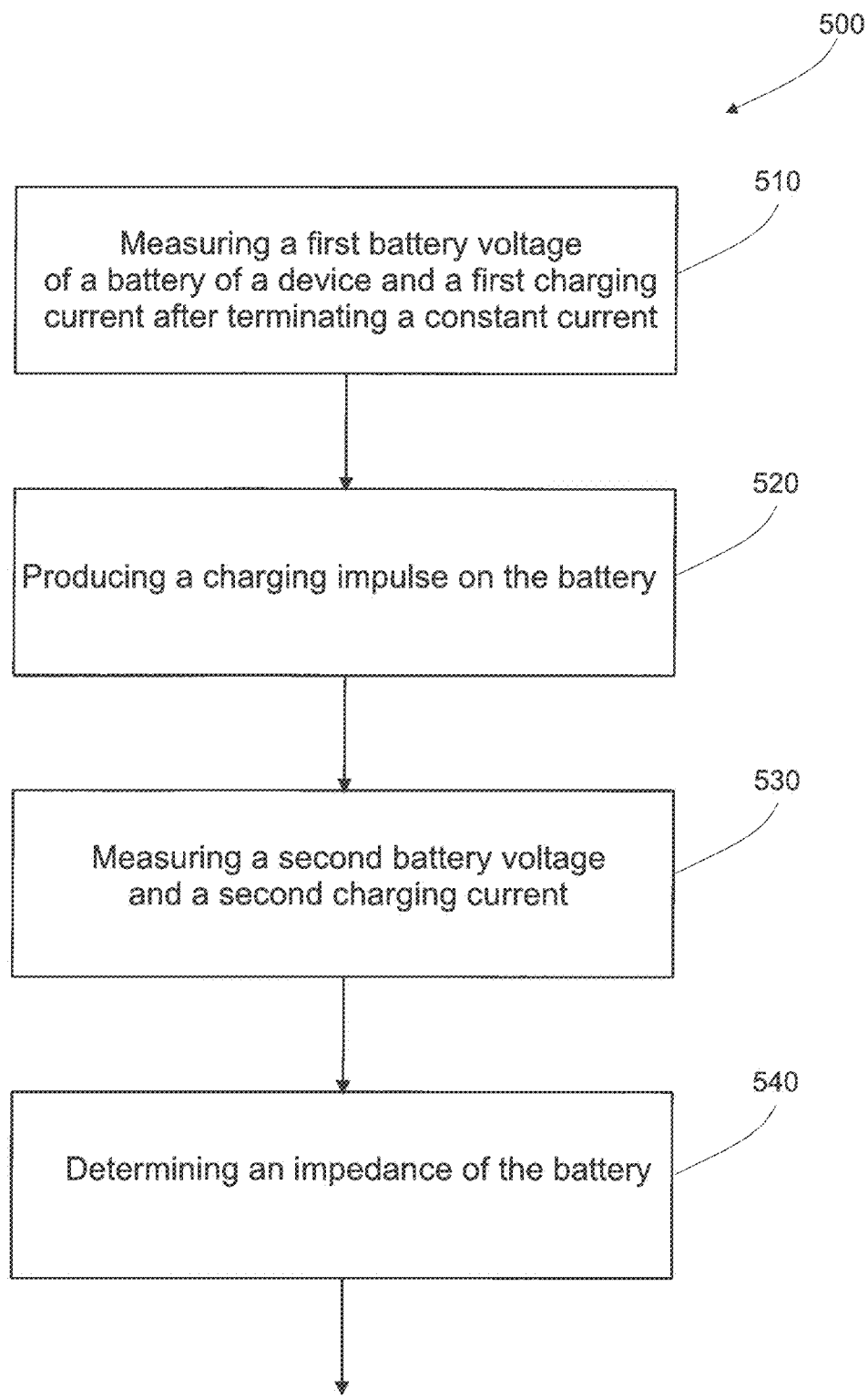
FIG. 5 shows a flow chart of a battery state determining method according to an example embodiment

FIG. 5 shows a flow chart of a battery state determining method 500 according to an example embodiment. In the method 500, in step 510, the device measures a first battery voltage of a battery of a device and a first charging current after terminating a constant current charging mode. In step 520, the device produces a charging impulse on the battery. In step 530, the device measures a second battery voltage and a second charging current. The second charging current may be, for example, the current of the charging impulse. In step 540, the device determines an impedance of the battery on the basis of a voltage difference between the first and the second battery voltage and a difference between the first and the second charging current.

The various embodiments of the invention can be implemented with the help of computer program code that resides in a memory and causes the relevant apparatuses to carry out the invention. For example, a device may comprise circuitry and electronics for handling, receiving and transmitting data, computer program code in a memory, and a processor that, when running the computer program code, causes the device to carry out the features of an embodiment. Yet further, a network device like a server may comprise circuitry and electronics for handling, receiving and transmitting data, computer program code in a memory, and a processor that, when running the computer program code, causes the network device to carry out the features of an embodiment.

It is obvious that the present invention is not limited solely to the above-presented embodiments, but it can be modified within the scope of the appended claims.

The invention claimed is:

1. A method, comprising:
    measuring a first battery voltage of a battery of a device and a first charging current after terminating a constant current charging mode;
    producing a charging impulse on the battery;
    measuring a second battery voltage and a second charging current in response to terminating the constant current charging mode; and
    determining an impedance of the battery on a basis of a voltage difference between the first and the second battery voltage and a difference between the first charging current and the second charging current.

2. A method according to claim 1, wherein the second charging current is the current of the charging impulse.

3. A method according to claim 1, wherein the method comprises determining a state of the battery on a basis of the determined impedance.

4. A method according to claim 3, wherein the state of the battery is determined by comparing the determined impedance to other impedances determined for the battery.

5. A method according to claim 3, wherein the state of the battery is determined by comparing the determined impedance to average impedance values determined for the battery.

6. A method according to claim 3, wherein the state of the battery is determined by comparing the determined impedance to individual impedance values or average impedance values of at least one same type of battery.

7. A method according to claim 1, wherein the method further comprises:
    indicating a state of the battery if determined impedance exceeds a predetermined threshold value arranged for the determined impedance.

8. A method according to claim 1, wherein the method further comprises:
    adjusting charging parameters of the device on a basis of the determined impedance.

9. An apparatus comprising at least one processor, memory including computer program code, the memory and the computer program code configured to, with the at least one processor, cause the apparatus to perform at least the following:
    measure a first battery voltage of a battery of a device and a first charging current after terminating a constant current charging mode and before initiating a constant voltage charging mode;
    produce a charging impulse on the battery;
    measure a second battery voltage and a second charging current in response to terminating the constant current charging mode; and
    determine an impedance of the battery on a basis of a voltage difference between the first and the second battery voltage and a difference between the first charging current and the second charging current.

10. An apparatus according to claim 9, wherein the second charging current is the current of the charging impulse.

11. An apparatus according to claim 9, wherein the computer program code is further configured to, with the at least one processor, cause the apparatus to:
   determine a state of the battery on a basis of the determined impedance.

12. An apparatus according to claim 11, wherein the state of the battery is determined by comparing the determined impedance to other impedances determined for the battery.

13. An apparatus according to claim 11, wherein the state of the battery is determined by comparing the determined impedance to average impedance values determined for the battery.

14. An apparatus according to claim 11, wherein the state of the battery is determined by comparing the determined impedance to individual impedance values or average impedance values of at least one same type of battery.

15. An apparatus according to claim 9, wherein the computer program code is further configured to, with the at least one processor, cause the apparatus to: indicate a state of the battery if determined impedance exceeds a predetermined threshold value arranged for the determined impedance.

16. An apparatus according to claim 9, wherein the computer program code is further configured to, with the at least one processor, cause the apparatus to:
   adjust charging parameters of the device on the basis of the determined impedance.

* * * * *